PHASE-LOCK LOOP WITH ADAPTIVE BANDWIDTH

Filed Aug. 24, 1965 4 Sheets-Sheet 1

INVENTORS:
WILLIAM E. DE LISLE
CHARLES J. KREBS
BY
ATTORNEY

INVENTORS:
WILLIAM E. DE LISLE
CHARLES J. KREBS
BY
ATTORNEY

INVENTORS:
WILLIAM E. DE LISLE
CHARLES J. KREBS
BY
Spencer E. Olson
ATTORNEY

June 27, 1967 W. E. DE LISLE ET AL 3,328,719

PHASE-LOCK LOOP WITH ADAPTIVE BANDWIDTH

Filed Aug. 24, 1965 4 Sheets-Sheet 4

INVENTORS:
WILLIAM E. DE LISLE
CHARLES J. KREBS

BY Spencer E. Olson

ATTORNEY

3,328,719
PHASE-LOCK LOOP WITH ADAPTIVE BANDWIDTH

William E. De Lisle, Buffalo, and Charles J. Krebs, Williamsville, N.Y., assignors to Sylvania Electric Products Inc., a corporation of Delaware Filed Aug. 24, 1965, Ser. No. 483,028
6 Claims. (Cl. 331—17)

This application is a continuation-in-part of applicants' previous and now abandoned application Ser. No. 266,565, filed Mar. 20, 1963.

Among the many applications of a phase-lock loop is its utilization in receivers to increase the power level and attenuate noise in a weak frequency modulated signal with somewhat different design parameters, it can be used to reduce jitter in a high-power oscillator, or it can be employed as a filter of arbitrarily narrow bandwidth for the selection of a desired signal and attenuation of unwanted components while at the same time reducing phase jitter. Phase-lock loops are also useful for the efficient detection and tracking of narrow band signals in the presence of wide band noise. Additional uses include incorporation in a sinusoidal carrier receiver to provide synchronization, and it may be used to advantage in systems requiring correlation and/or bit synchronization.

The basic elements of a known elementary phase-lock oscillator loop are illustrated in FIG. 1. If it is assumed that the oscillator frequency is equal to that of the input signal, the output of the phase detector 10 is a DC voltage of amplitude dependent on the phase difference between the oscillator signal and the input signal. This DC voltage is applied through a low pass filter 14 to the control element of a voltage controlled oscillator 12 to thereby govern the frequency of the oscillator. If the frequency of the oscillator tends to change, the tendency is first manifested as a phase difference change in the phase detector, causing a change in the amplitude of the DC output voltage therefrom which when applied to the oscillator returns the frequency to the desired value. The frequency of the oscillator 12, and consequently the phase of its output signal relative to that of the input signal, will drift to some extent, but the average output frequency is maintained substantially constant.

The characteristics of a phase-lock loop of principal interest in connection with the present invention are capture range and lock bandwidth. Capture range is defined as the largest unlocked frequency difference at which synchronization, or lock-in, will occur, and the bandwidth of the loop is a factor of merit of the loop as a low pass filter with respect to FM noise components in the input signal and as a high pass filter with respect to FM noise components generated within the oscillator portion of the loop. It is a general object of the present invention to provide a phase-locked oscillator control loop having wide capture range, small random walk when locked, the ability to maintain frequency offset during fading of the input signal, and a short capture time.

Two factors which affect loop bandwidth are its gain and the value of the components in the low pass filter. Prior art phase-lock loop designs of which applicants are aware employ either a fixed loop bandwith, a variable loop bandwidth accomplished by manual adjustment of the values of the filter components, or a bandwidth variable in increments in response to the application of gating signals which vary the filter constants in stepwise fashion. These designs represent a compromise between capture range, capture time, and random walk, and often place difficult and/or expensive constraints on the nature of the input signal; for example, the transmitting equipment with which the receiver containing the phase-lock loop is used must be very carefully controlled.

Some improvement of these previous designs would appear to be possible by inserting a band pass limiter in advance of the loop. Then, if the noise input to the system increases, the signal strength at the output of the limiter would decrease because of the property of the limiter of holding the total output power constant. As previously mentioned, however, the noise bandwidth of the loop is directly dependent on the signal amplitude at the output of the limiter. Therefore, the increase in input noise resulting from reduction in the signal amplitude at the output of the limiter will reduce the loop bandwidth. Although this modification is quite useful for applications where it is desired to vary bandwidth as a function of signal-to-noise ratio, it is not satisfactory in cases requiring control of loop bandwidth in response to other parameters, such as frequency offset or error signal level.

All of the heretofore described prior art phase-lock techniques have the further disadvantage that during periods of fading which exceed the time constant of the phase loop, the error signal is lost, causing the voltage on the control element of the oscillator to return to its rest value, and the loss of frequency offset information. Such fading, or more accurately, the loss of the error signal could result from such factors as fading of the input signal, reception of a long series of "ones" or "zeros" in a bit synchronization system, and the problem is inherent in systems in which the transmission of intelligence is at low bit rates; e.g., telemetry systems.

The characteristics of phase-lock loops and some of the approaches which have been used to optimize their performance are described in Progress Report No. 20–243 of the Jet Propulsion Laboratory of the California Institute of Technology entitled "Design and Performance of Phase-Lock Loops Capable of Near Optimum Performance Over a Wide Range of Input Signal and Noise Levels" by R. Jaffe and E. Rechtin, dated Dec. 1, 1954. Pages 5 and 6 and appendices A, B and C of this report are of particular interest in connection with the present invention. This report on page 8 gives a comparison of automatic gain control, limiter, and variable parameter loops, and offers the conclusion (on page 10) that a phase-lock loop preceded by a bandpass limiter approximates, over a wide range of input signal and noise levels, the optimum performance obtainable only with a variable filter continuously readjusted for optimization by an auxiliary servo system. The burden of this conclusion, when considered with the rest of the report, is that the bandpass limiter technique was selected as most feasible because of the recognized difficulties of mechanizing a filter to be continuously adjusted to keep the performance of the loop at optimum.

With an appreciation of the foregoing shortcomings of available phase-lock loop techniques, applicants have as a general object of their invention to provide an improved phase-lock loop capable of performance approaching the optimum over a wide range of input signal and noise levels.

A more particular object of the invention is to provide a phase-lock loop having an adaptive bandwidth utilizing a variable filter which is relatively easily implemented.

Another object is to provide a phase-lock loop having the ability to maintain frequency offset during periods of fading of the detected signal.

A further object is to provide a phase-lock loop having a wide capture range and small capture time.

Still another object of the invention is to provide a phase-lock loop which allows only small random walk when locked.

Briefly, these and related objects are achieved by the incorporation in a phase-lock loop of the type including a phase detector, filter, and a voltage controlled oscillator, a filter whose bandwidth is automatically adaptive in response to a control signal derived from a circuit which analyzes the input signal. The signal analyzer is operative to cause the filter to have a wide loop bandwidth for large frequency differences between the input signal and the controlled oscillator to enable rapid frequency search and capture, and to cause a narrower loop bandwidth as the controlled oscillator frequency approaches that of the incoming signal to thereby phase-lock the oscillator to the incoming signal and reduce random walk or drift. In a preferred embodiment, the filter includes one or more variable resistors, each of which is a photo-sensitive device whose resistance is varied by the intensity of light incident thereon, which, in turn, is varied in accordance with a control signal from the signal analyzer. To maintain frequency offset during fading of the input signal, a digital phase detector, in combination with a push-pull drive and decoupling circuit, is used to provide a bi-polar or push-pull drive to the filter to thereby indicate the direction of phase error.

Other objects, features and advantages of the invention, and a better understanding of its organization and operation, will become apparent from the following description, reference being had to the accompanying drawings, in which.

Figure 1:
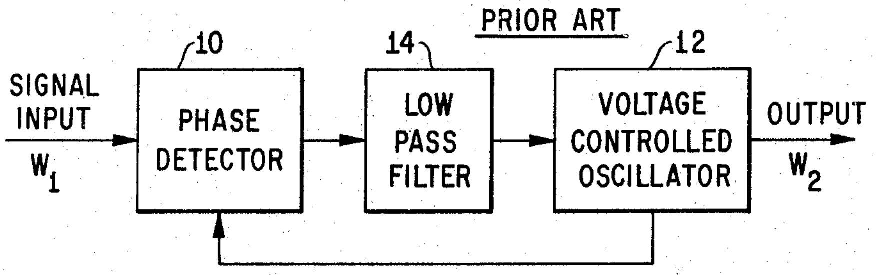
FIG. 1 is a block diagram of an elementary prior art phase-lock loop referred to earlier and to which further reference will not be made.
Figure 2:
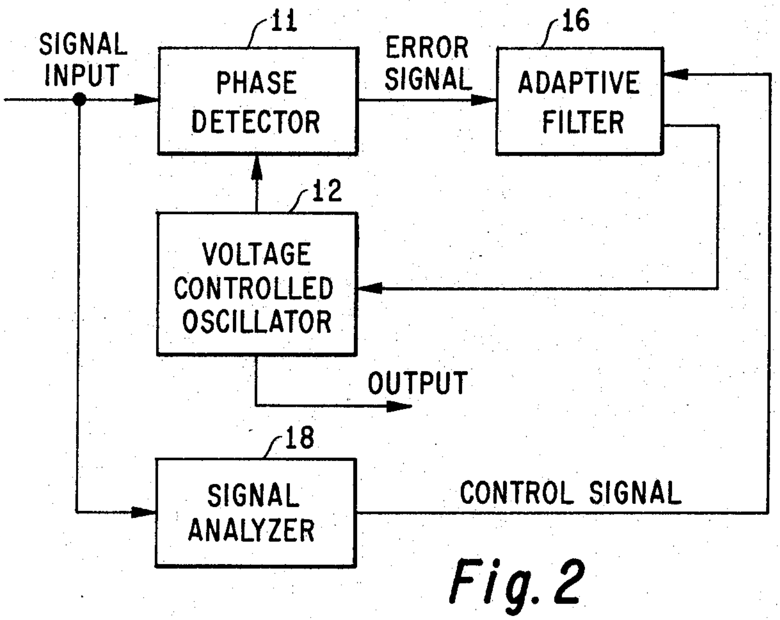
FIG. 2 is a general block diagram of a phase-lock loop embodying the present invention.

Referring now to FIG. 2, the phase-lock loop according to the present invention comprises generally a phase detector 11 and a signal analyzer 18 to which the input signal is applied in parallel, an adaptive filter 16 to which the outputs of the phase detector and signal analyzer are applied, and a voltage controlled oscillator 12 whose frequency is controlled by a signal from the adaptive filter and whose output is applied to phase detector 11. The phase error signal detected by phase detector 11, which may be of either digital or analog design, is applied to adaptive filter 16 which converts it to a steering voltage signal for controlling the frequency of oscillator 12. Depending on the system in which the phase-lock-loop is incorporated, the signal analyzer 18 may measure the frequency or phase difference between the input signal and the output of the voltage controlled oscillator 12, the difference in signal level between the input signal and that of the voltage controlled oscillator, signal-to-noise ratio, correlation error, or some other parameter of interest of the system in which it is used. Suffice it to say for purposes of describing the block diagram of FIG. 2, a signal analyzer 18 develops a control signal which is applied to an electrically variable component in adaptive filter 16 to control the bandwidth of the filter in proportion to the magnitude of the control signal. The control is in a direction such as to provide a wide loop bandwidth for large frequency or phase differences, or correlation errors, to enable rapid search and capture, and to provide a narrower loop bandwidth as the controlled oscillator approaches the frequency or phase of the incoming signal, or causes a local code pattern generator to approach correlation with the incoming pattern. It will be recognized that the signal analyzer will take different forms depending on the nature of the transmissions to be received, and a number of such variations will be described in greater detail hereinafter. The voltage controlled oscillator may take any of a number of known forms which include means for controlling the frequency in response to the magnitude of an applied direct current voltage; e.g., a variable capacitance diode.

Figure 3:
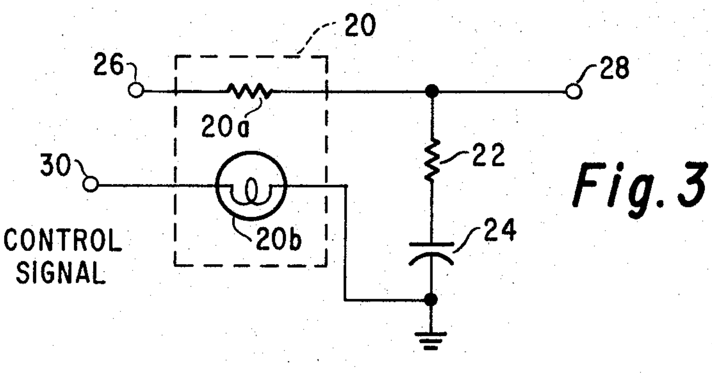
FIG. 3 is a circuit diagram of the adaptive filter of FIG. 2.
Figure 4:
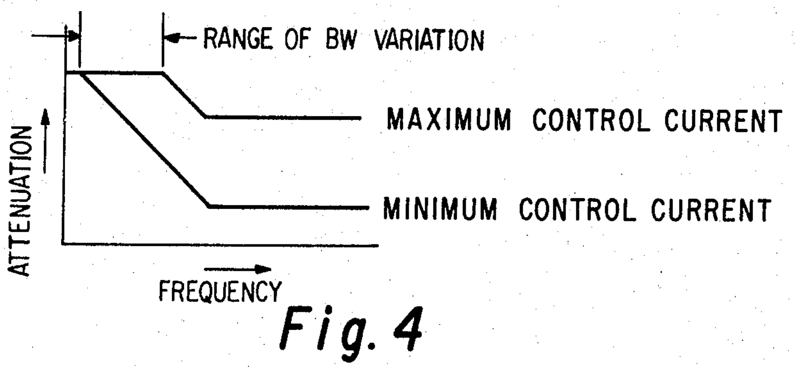
FIG. 4 are curves showing the bandwidth response of the adaptive filter as a function of control current.

Referring now to FIG. 3, the adaptive filter 16 of FIG. 2 may take the form of a simple RC low pass filter including serially connected resistor 22 and capacitor 24, both of fixed value, and a second resistor 20, the resistance of which is variable in response to a control signal. In the disclosed embodiment, the element **20*a* is a photo-sensitive resistor, the resistance of which varies in response to the intensity of light incident thereon. Light is directed onto the photo-sensitive resistor from a light source, such as a lamp 20*b*, the elements 20*a* and 20*b* preferably being supported in fixed relationship to each other, as in a common module. A device known as a "Raysistor," available from Raytheon Company, is satisfactory for use as the voltage variable resistor 20. The error signal from the phase detector 11 (FIG. 2) is applied to terminal 26 of the filter, and the steering voltage for the controlled oscillator is derived at terminal 28. The control current from signal analyzer 18, which is proportional to frequency or phase difference, is applied to the terminal 30 for energization of lamp 20*b*. The resistance of the photo-sensitive resistor described is of minimum value at maximum light intensity, and the system of FIG. 2 is arranged such that the intensity of the light source is maximum when the system is out of synchronism. This results in the filter bandwidth being widest when the oscillator is searching for phase correlation. As phase correlation is approached, the control current decreases, reducing the intensity of the light source and increasing the resistance of element 20*a***, thereby narrowing the bandwidth of the filter. As this process continues until the phase or frequency difference is reduced to zero, the variable resistor reaches its maximum value, reducing the bandwidth of the filter to its minimum value. As previously mentioned, the narrow loop bandwidth minimizes random walk or drift after the oscillator is phase-locked to the input signal. The filter response curves of FIG. 4 show the variation of bandwidth of the filter as a function of control current.

Figure 5:
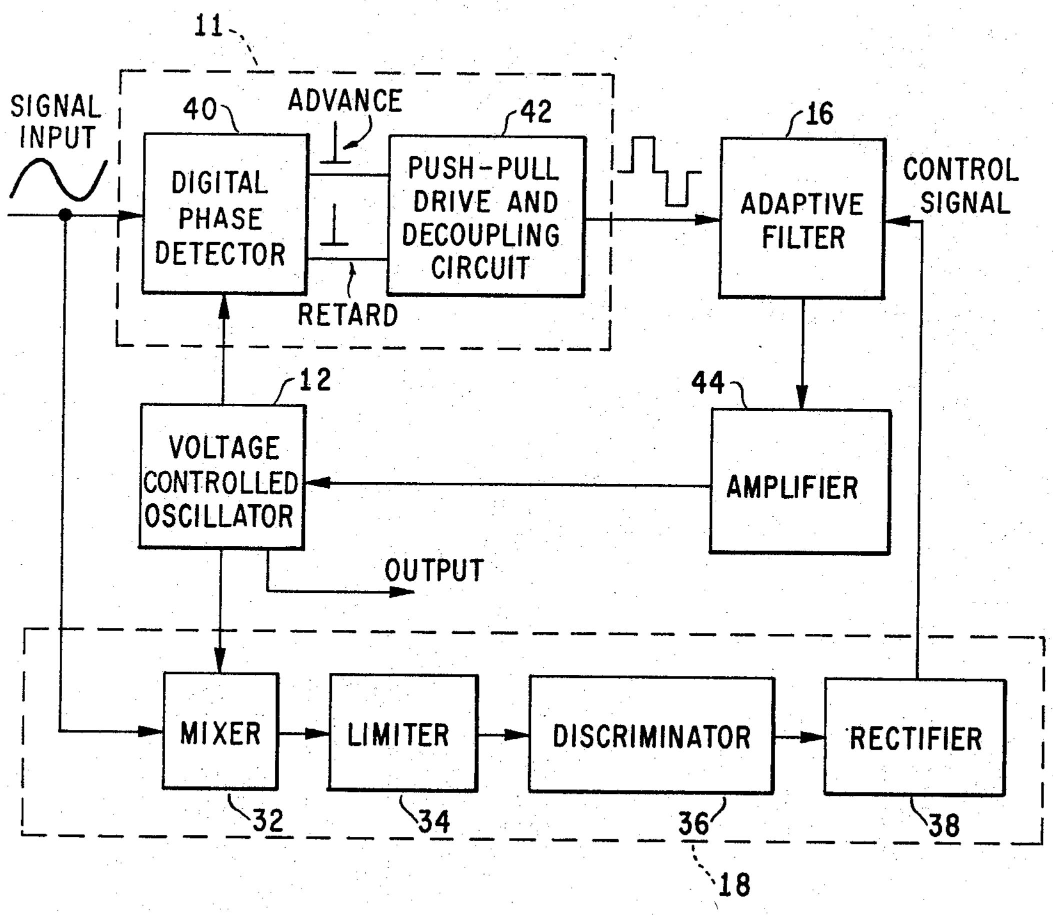
FIG. 5 is a block diagram of the phase-lock loop of the invention showing in block diagram form a signal analyzer suitable for use in a sinusoidal carrier receiver.

It has been noted earlier that the described filter is useful with several types of transmissions; FIG. 5 shows in block diagram form an adaptation of the technique in a sinusoidal carrier receiver. In this application, the signal analyzer 18 (FIG. 2) comprises a mixer 32, a limiter 34, a discriminator 36 and a rectifier 38. The incoming signal is applied to the mixer where it is mixed with an output signal from controlled oscillator 12 to produce a frequency difference signal. The output of mixer 32 is maintained at a fixed amplitude by limiter 34 and applied to a discriminator which measures the difference frequency. The output of the discriminator is rectified to produce a direct current control current of amplitude proportional to the difference frequency for application to terminal 30 of the adaptive filter of FIG. 3. The mixer, limiter, discriminator and rectifier may be of designs well known to the art and therefore have not been described in detail.

In the circuit of FIG. 5, the phase detector includes a digital phase detector 40 for detecting the phase error between the signal from oscillator 12 and the sinusoidal carrier input signal, and delivering "advance" and "retard" output pulses, as shown, to a push-pull drive and decoupling circuit 42. The output of the decoupling circuit, consisting of a push-pull phase error signal, is applied to terminal 26 of the adaptive filter. The steering voltage output of adaptive filter 16 is applied through a suitable amplifier 44 to the control element of oscillator 12 to vary its frequency in a direction to reduce the phase error signal to zero.

Figure 6:
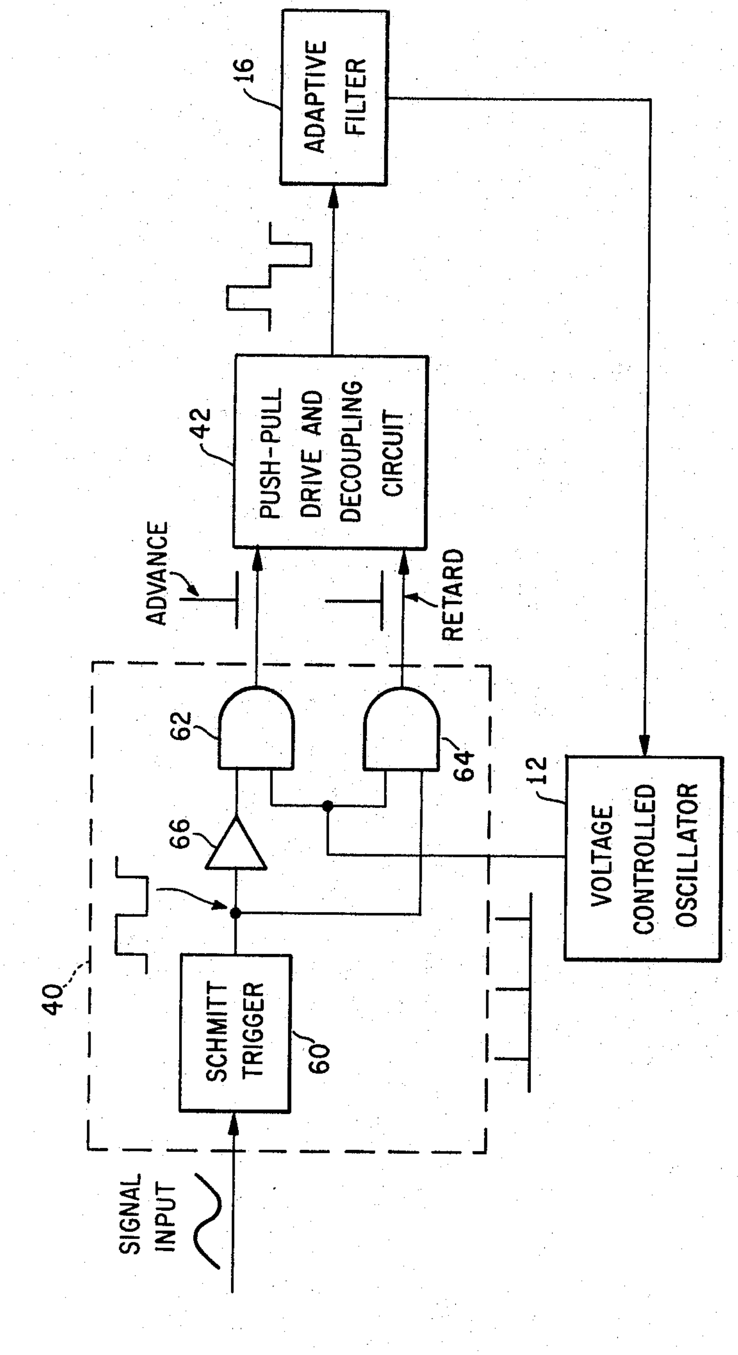
FIG. 6 is a block diagram of a digital phase detector useful in the phase lock loop of FIG. 5.

Digital phase detectors for various applications are well known to the art. For example, one rather simple digital circuit suitable for use as detector 40 in the sinusoidal carrier system of FIG. 5 is shown in FIG. 6 and comprises a Schmitt trigger circuit 60 for converting the sinusoidal input signal to a square wave, a pair of AND gates 62 and 64, and an inverter 66. The square wave from the Schmitt trigger is applied directly to an input of AND gate 64 and through inverter 66 to an input of AND gate 62. In this instance, the circuit of voltage controlled oscillator 12 is selected so as to provide an output signal to detector 40 which comprises a train of very narrow pulses having a pulse rate at the oscillator frequency. This pulse train from the oscillator is applied in parallel to the other inputs of AND gates 62 and 64. Consequently, the AND gates function as a pair of phase comparison sampling gates. If the phase of an oscillator output pulse is such that it occurs during the positive half cycle of the square wave from Schmitt trigger 60, gate 64 will allow the pulse and gate 62 will inhibit the pulse; assuming the negative axis crossing as the time reference, this phase comparison indicates that the oscillator pulse output leads the input signal and is operative to generate a "retard" pulse. If the oscillator output pulse occurs during the negative half cycle of the Schmitt trigger output square wave, gate 64 will inhibit the pulse and gate 62 will pass the pulse, indicating that the oscillator signal lags the input signal and producing an "advance" pulse. The detector and associated push-pull drive and decoupling circuit 42 take advantage of the RC inertia of the adaptive filter to maintain the frequency offset of oscillator 12 in the event of fading in the error signal from the phase detector, as will now be described with reference to FIG. 7.

Figure 7:
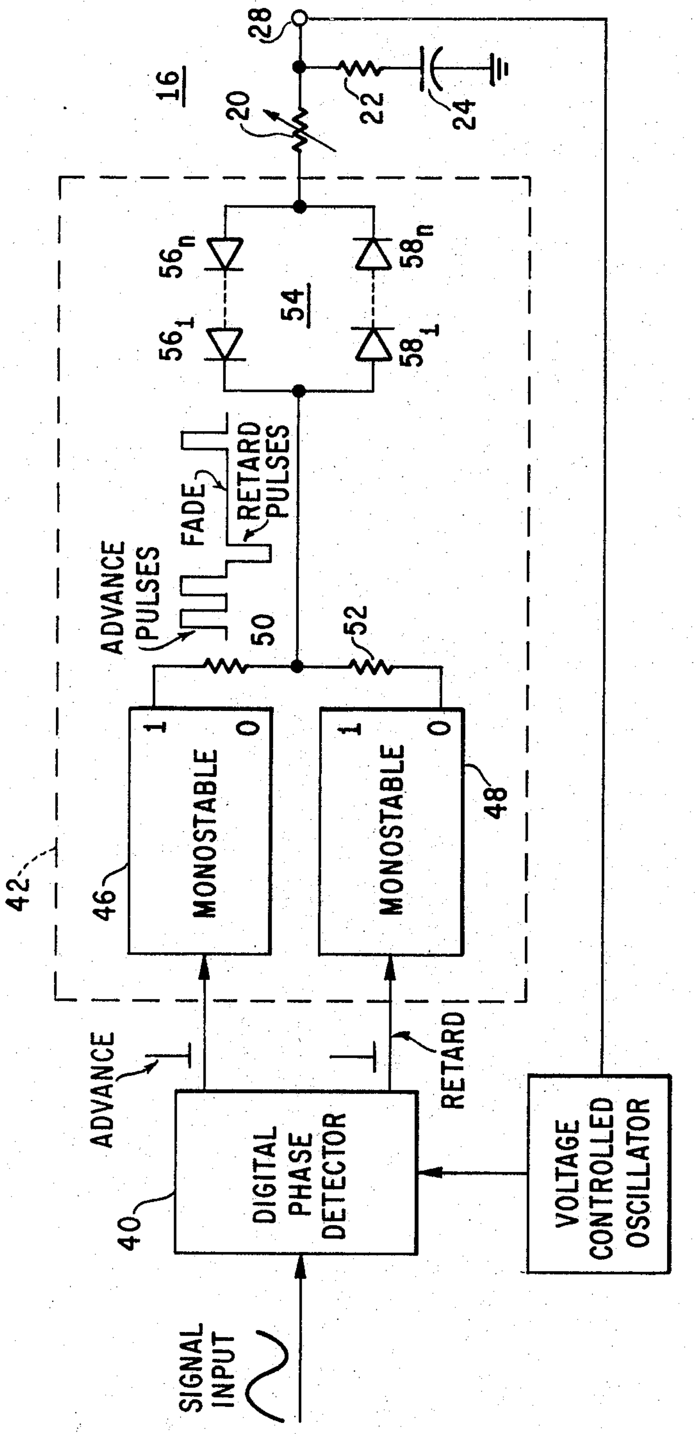
FIG. 7 is a block diagram of a push-pull drive and decoupling circuit useful in the phase-lock loop of FIG. 5.

Referring to FIG. 7, the decoupling circuit 42 comprises a pair of monostable multivibrators 46 and 48 the outputs of which are respectively applied to a pair of resistors 50 and 52, the junction of which is connected to a network 54 of parallel sets of oppositely polarized diodes. In the event the phase of the input signal is leading that of the signal from voltage controlled oscillator 12, the digital phase detector 40 is operative to produce an "advance" pulse to the monostable 46. An output signal is taken only from the "one" side of the monostable 46 so as to deliver to resistor 50 only positive pulses upon being triggered by an "advance" pulse. Should the input signal lag the oscillator signal, the phase detector applies a "retard" pulse to the other monostable from which an output signal is taken only from its "zero" side. Consequently monostable 48 produces only negative pulses upon being triggered by a "retard" pulse. The output pulses from both monostables are summed through resistors 50 and 52, respectively, to provide a bipolar (push-pull) pulsed output which indicates the direction of phase error. The output of this push-pull drive circuit is coupled to adaptive filter 16 through a decoupling network 54 consisting of two oppositely polarized parallel branches of series connected diodes $56_1$ through $56_n$ and $58_1$ through $58_n$. The total forward voltage drop of each series set of diodes is chosen to be smaller than the amplitude of the push-pull drive pulses, thereby allowing a phase error input signal to reach the adaptive filter. The phase error signal, which consists of "advance" and "retard" pulses, is stored in capacitor 24 of the filter, whereby the voltage on this capacitor, at any instant, is representative of the integrated value of the input signal, and as previously described, is applied as a steering voltage to control the frequency of oscillator 12.

Because of the voltage divider action of filter resistors 20 and 22, there is a relatively small charge buildup on capacitor 24. This allows the diodes of network 54 to be chosen such that the total forward voltage drop of each series set is larger than the maximum expected error voltage on capacitor 24. As a result, the network 54 virtually open-circuits the low pass filter 16 from the source of error signals during complete signal fade (i.e., no bi-polar pulses from the push-pull drive), thereby preventing a loss of steering voltage level and maintaining the oscillator 12 at the correct frequency. In other words, the decoupling circuit 54 effectively increases the filter time constant so that the circuit can tolerate relatively long periods of fade. This feature is very useful under conditions of fading due to transmission or system characteristics, and provides an exceptional advantage in low bit rate telemetry.

From the foregoing it is seen that applicants have provided a phase-lock loop having large bandwidth for capture and a narrow bandwidth for lock. It can capture rapidly in spite of large frequency offsets, and has the advantage of being able to maintain a large frequency offset during periods of error signal fading. The circuitry for obtaining this improvement in performance is relatively easily implemented with available circuitry and components.

While a preferred embodiment of the invention has been described, it will be understood that it is not limited to the particular features and system illustrated. As has been mentioned, an analog phase detector may be employed, and other forms of digital phase detectors and signal analyzer configurations may be used, depending upon whether the system is intended for use in a correlation receiver, in a bit synchronizer, etc. In a correlation system, for example, the phase lock-loop may be applied to control the clock frequency of the receiver. In this case, the "advance" and "retard" drive pulses for monostables 46 and 48 may be derived from a decision circuit following the correlation receiver channels. The control signal for the adaptive filter could be derived by sampling the amplitude of the I.F. signal output from one of the correlation mixers, over a given threshold value, and applying it to the adaptive filter through a low pass filter.

If incorporated in a bit synchronizer, the control signal for the adaptive filter may be obtained by counting and integrating the transitions of the input signal, which would cause the bandwidth to be increased in the absence of an input signal.

Therefore, it is seen that the control current for the filter may be derived from a variety of sources depending upon the application of the loop, and as has been suggested, it need not necessarily depend on a measurement of frequency difference as in the circuit of FIG. 5. For example, the amplitude of the control signal may be a function of signal level, signal-to-noise ratio or some other parameter of the system in which the phase-lock loop is used. It will be understood also that the filter may take other forms than that illustrated; e.g., more than one of the disclosed variable resistors may be required in applications involving more complex transfer functions. It will be recognized also that the described push-pull drive and decoupling technique is not limited in its application to a phase lock-loop having an adaptive filter, but is equally applicable to fixed loop systems. It is intended, therefore, that the scope of the invention be limited only by the appended claims.

What is claimed is:

1. A phase-lock loop comprising, in combination: a phase detector having first and second input terminals and an output terminal; means for applying an input signal to said first input terminal; a voltage controlled oscillator having a control element and an output terminal connected to the second input terminal of said phase detector, said phase detector being operative in response to a difference in phase between said input signal and the output signal of said oscillator to produce an error signal; a filter circuit having input and output terminals and including a variable resistance component comprising a photo-sensitive resistor connected in said filter circuit, a light source optically coupled to said resistor and means for applying an electric current to said light source to control the intensity thereof; means connecting the output terminal of said detector to the input terminal of said filter; means connecting the output terminal of said filter to said control element of said oscillator; and, circuit means connected between the first input terminal of said phase detector and said variable resistance component of said filter and operative in response to variations in a selected characteristic of the input signal to produce a correspondingly varying current in said variable resistance component to thereby proportionately adapt the bandwidth of said filter to variations in said selected characteristic.

2. A phase-lock loop comprising, in combination, a phase detector having first and second input terminals and an output terminal, means for applying an input signal to said first input terminal, a voltage controlled oscillator having a control element and an output terminal connected to the second input terminal of said phase detector, said phase detector being operative in response to a difference in phase between said input signal and the output signal of said oscillator to produce an error signal, a filter circuit having input and output terminals and including a frequency-determining component whose value is proportionally variable in response to an electric current, means connecting the output terminal of said detector to the input terminal of said filter, means connecting the output terminal of said filter to said control element of said oscillator, a mixer to which said input signal and the output signal of said oscillator are applied, a discriminator coupled to the output of said mixer for measuring the difference between the frequency of said input signal and the frequency of said oscillator, and means coupled between said discriminator and said frequency-determining component of said filter and operative to apply an electric current to said frequency-determining component having a magnitude proportional to said frequency difference to thereby proportionately adapt the bandwidth of said filter to variations in said frequency difference.

3. An oscillator adapted to capture and lock onto the frequency of an input signal comprising, in combination, an oscillator having an output terminal and a control element, the frequency of said oscillator being variable in response to a control signal applied to said control element, a phase detector having first and second input terminals to which said input signal and the output of said oscillator are respectively applied, and an output terminal, said phase detector being operative in response to a difference in phase between said input signal and the output of said oscillator to produce an error signal of sense and magnitude proportional to said frequency difference, a low pass filter circuit having input and output terminals and including a variable resistor comprising a photo-resistive element connected in said filter circuit and a light source optically coupled to said element, means connecting the output terminal of said phase detector to the input terminal of said filter, means connecting the output terminal of said filter to the control element of said oscillator, and circuit means connected to said light source and to which said input signal is applied and being operative in response to variations in the magnitude of a selected characteristic of said input signal to produce a proportionally varying current through said light source to vary the intensity thereof and thereby vary the resistance of said photo-sensitive element to adapt the bandwidth of said filter to variations in the magnitude of said selected characteristic.

4. A phase-lock loop comprising, a digital phase detector having first and second input terminals and first and second output terminals, means for coupling a source of input signals to the first input terminal of said detector, a voltage controlled oscillator having an output terminal and a control element, the frequency of said oscillator being controllable in response to a control signal applied to said control element, means connecting the output terminal of said oscillator to the second input terminal of said phase detector, said phase detector being operative in response to the phase of the input signal applied to its first input terminal lagging or leading the phase of the oscillator signal to produce pulses at its first or second output terminal, respectively, first and second monostable multivibrators each having a trigger input terminal and an output terminal, means respectively connecting the first and second output terminals of said phase detector to the input terminal of said first and second multivibrators, means connected to the output terminals of said multivibrators for summing oppositely poled output pulses therefrom, a filter circuit having input and output terminals, first and second sets of series-connected diodes connected between said summing means and the input terminal of said filter, said sets of diodes being connected in parallel and oppositely poled relative to each other, and means connecting the output terminal of said filter to the control element of said oscillator.

5. A phase-lock loop in accordance with claim 4 wherein said filter includes a capacitor, and wherein said sets of diodes have a forward voltage drop smaller than the amplitude of the pulses from said summing means and larger than the maximum storage voltage developed across said capacitor whereby said diodes are operative to decouple said filter from said summing means during periods of absence of pulses from said summing means.

6. A phase-lock loop in accordance with claim 4 wherein said filter circuit includes a variable photo-resistive element connected in series between said input and output terminals and a light source optically coupled to said element, and further including circuit means connected to said light source and to which said input signal is applied and operative in response to variations in the magnitude of a selected characteristic of said input signal to produce a proportionally varying current through said light source to vary the intensity thereof and thereby vary the resistance of said photo-resistive element to adapt the bandwidth of said filter to variations in the magnitude of said selected characteristic.

References Cited

UNITED STATES PATENTS 2,962,666 11/1960 Pollak ------------ 331—17 X

ROY LAKE, *Primary Examiner.*

S. H. GRIMM, *Assistant Examiner.*